(12) United States Patent
Savanth et al.

(10) Patent No.: US 9,831,831 B2
(45) Date of Patent: Nov. 28, 2017

(54) INTEGRATED OSCILLATOR CIRCUITRY

(71) Applicant: ARM Limited, Cambridge (GB)

(72) Inventors: Parameshwarappa Anand Kumar Savanth, Cambridge (GB); Shidhartha Das, Upper Cambourne (GB); James Edward Myers, Bottisham (GB); David Michael Bull, Cambridge (GB); Bal S. Sandhu, Fremont, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/009,556

(22) Filed: Jan. 28, 2016

(65) Prior Publication Data

US 2017/0222602 A1 Aug. 3, 2017

(51) Int. Cl.
| | |
|---|---|
| *H03K 3/0231* | (2006.01) |
| *H03K 4/50* | (2006.01) |
| *H03L 1/00* | (2006.01) |
| *H03B 5/24* | (2006.01) |

(52) U.S. Cl.
CPC ............. *H03B 5/24* (2013.01); *H03K 3/0231* (2013.01); *H03K 4/50* (2013.01); *H03L 1/00* (2013.01)

(58) Field of Classification Search
CPC .......... H03B 5/24; H03K 3/0231; H03K 4/50; H03L 1/00
USPC ..... 331/108 B, 111, 135–137, 143, 185, 186
See application file for complete search history.

(56) References Cited

U.S. PATENT DOCUMENTS

| | | | | |
|---|---|---|---|---|
| 3,742,384 | A | * | 6/1973 | Breitzmann ............. H03K 7/06 331/108 D |
| 3,967,216 | A | * | 6/1976 | Sakamoto .............. H03K 4/501 331/108 D |
| 4,316,155 | A | * | 2/1982 | Hanisko .................... H03L 1/00 327/101 |
| 6,163,190 | A | | 12/2000 | Takai et al. |
| 6,825,735 | B2 | * | 11/2004 | Chung ..................... H03B 5/04 331/135 |
| 7,863,992 | B2 | * | 1/2011 | Chung .................. H03K 4/501 327/131 |
| 9,397,639 | B2 | * | 7/2016 | Feldman ............ A61N 1/36125 |
| 2004/0036545 | A1 | | 2/2004 | Chung |
| 2007/0233912 | A1 | * | 10/2007 | Piasecki ............... H03K 3/0231 710/61 |

(Continued)

FOREIGN PATENT DOCUMENTS

| | | |
|---|---|---|
| CH | 694541 A5 | 3/2005 |
| EP | 2887545 A1 | 6/2015 |

OTHER PUBLICATIONS

Lee, et al.; A 4.7MHz 53μW Fully Differential CMOS Reference Clock Oscillator with -22dB Worst-Case PSNR for Miniaturized SoCs; IEEE ISSCC 2015, Session 5; pp. 106,107,107a; Feb. 23, 2015.

(Continued)

*Primary Examiner* — Levi Gannon
(74) *Attorney, Agent, or Firm* — Pramudji Law Group PLLC; Ari Pramudji

(57) ABSTRACT

Various implementations described herein are directed to an integrated circuit. The integrated circuit may include a comparator stage, a resistor, a capacitor, and active switches arranged to provide a clock signal having a time period that is independent of a first source voltage. Independence may be achieved by using a second source voltage derived from the first source voltage as a fixed ratio.

20 Claims, 10 Drawing Sheets

(56) References Cited

U.S. PATENT DOCUMENTS

2015/0270804 A1* 9/2015 Blaauw .................. H03K 4/502
331/108 R

OTHER PUBLICATIONS

Griffith, et al.; A 190nW 33kHz RC Oscillator with ±0.21% Temperature Stability and 4ppm Long-Term Stability IEEE ISSCC 2014, Session 17; pp. 300,301,301a; Feb. 11, 2014.

Paidimarri, et al.; A 120nW 18.5kHz RC Oscillator with Comparator Offset Cancellation for ±0.25% Temperature Stability; IEEE ISSCC 2013, Session 10; pp. 184,185, 185a; Feb. 19, 2013.

Hsiao; A 32.4 ppm/°C 3.2-1.6V Self-Chopped Relaxation Oscillator with Adaptive Supply Generation; VLSIC Symposium 2012; pp. 14-15; Jun. 13, 2012.

Denier; Analysis and Design of an Ultralow-Power CMOS Relaxation Oscillator; IEEE Transactions on Circuits and Systems I, Regular Papers; vol. 57, No. 8, pp. 1973-1982; Aug. 2010.

Sebastiano, et al.; A Low-Voltage Mobility-Based Frequency Reference for Crystal-Less ULP Radios; IEEE JSSC; vol. 44, No. 7, pp. 2002-2009; Jul. 2009.

Tokunaga, et al.; An on-chip CMOS relaxation oscillator with power averaging feedback using a reference proportional to supply voltage; IEEE ISSCC 2009; pp. 404,405,405a; Feb. 2009.

Choe, et al.: A Precision Relaxation Oscillator with a Self-Clocked Offset-Cancellation Scheme for Implantable Biomedical SoCs; IEEE ISSCC 2009, Session 23; pp. 402,403,403a; Feb. 11, 2009.

Sundaresan, et al.; Process and Temperature Compensation in a 7-MHz CMOS Clock Oscillator; IEEE JSSC; vol. 41, No. 2, pp. 433-442; Feb. 2006.

Al-Sarawi; Low power Schmitt trigger circuit; Electronics Letters; vol. 38, No. 18, pp. 1009-1010; Aug. 29, 2002.

Lasanen, et al.; A 1-V, Self-Adjusting, 5- MHz CMOS RC-Oscillator; IEEE ISCAS; vol. 4, pp. 377-380; May 2002.

PCT International Search Report and Written Opinion; PCT/GB2017/050116; dated Apr. 13, 2017.

* cited by examiner

100A

100B

INTEGRATED OSCILLATOR CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Relaxation oscillators are known in the art. FIG. 1A shows a conventional relaxation oscillator scheme 100A that uses a Schmitt inverter 110A to serve as a high gain hysteretic comparator, and as known, $V_{IL}$, $V_{IH}$ (Voltage Input Low and Voltage Input High) of the Schmitt inverter 110A are typically used to set trip points. However, $V_{IL}/V_{IH}$ may vary significantly with PVT (Process, Voltage, and Temperature), and hence, the conventional oscillator is less stable.

FIG. 1B shows another conventional relaxation oscillator scheme 100B that uses a fixed reference voltage Vref and a precision comparator 110B. In some cases, use of a low power comparator may result in significant delay that may affect oscillator stability. Thus, the scheme 100B may employ a relatively higher power design with use of the precision comparator 110B and a PVT independent reference generator 112. In this instance, some form of feedback FB may be employed via a feedback transistor T to correct the fixed reference voltage Vref or tune the precision comparator 110B so as to improve frequency stability. However, the fixed reference voltage Vref is non-ideal and does not typically perform well by design for stability when the supply voltage Vdd varies. Therefore, the scheme 100B may further use the feedback FB to compensate for variations in the reference voltage Vref so as to achieve better stability.

Another scheme (not shown) may refer to a differential resistor-capacitor (RC) network based relaxation oscillator that may be used to circumvent voltage dependence in a correct-by-design fashion. In some cases, the supply voltage (Vdd) is differentially sampled to cancel out variations. Reference generators are typically avoided by using a comparator's virtual ground as a reference to set a trip point. However, in practice, the comparator's virtual ground may move away from an ideal zero due to internal offsets, and thus, chopping may be used to average out any impact of offset to thereby improve stability. However, in this scheme, using differential sampling, a high power comparator, and a ring-oscillator increases power consumption, which should be avoided.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to integrated oscillator circuitry. For instance, in some implementations, the integrated oscillator circuitry may refer to a supply voltage (Vdd) independent integrated resistor-capacitor (RC) oscillator using a reference voltage (Vref), such as a fixed supply-ratio voltage reference and/or duty-cycling of a precision comparator for low power operation. In some scenarios, low voltage synchronous digital systems may be configured to utilize ultra-low power clock sources that run without a crystal reference. This means some form of on-chip oscillator may be used, such as an RC oscillator, and thus, the various implementations described herein refer to RC oscillator topology and circuit.

Various implementations of integrated oscillator circuitry provided herein will now be described in more detail with reference to FIGS. 2-8.

Figure 1A:
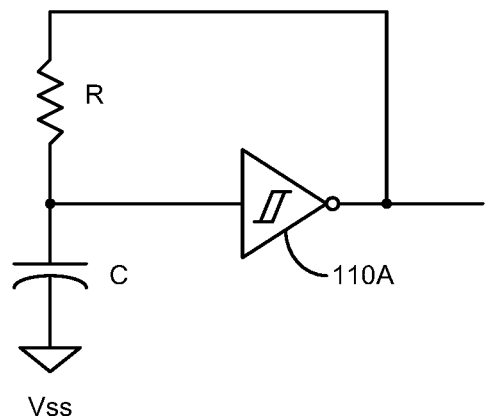
FIGS. 1A-1B illustrate diagrams of conventional relaxation oscillator circuitry as known in the art.
Figure 1B:
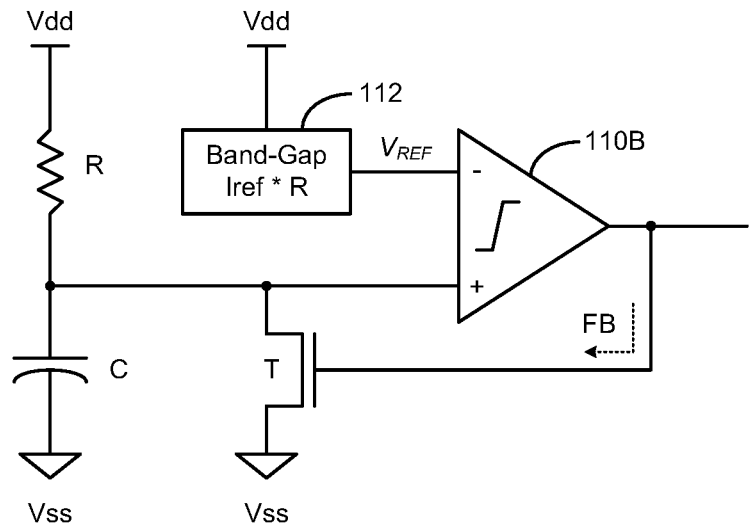
Figure 2:
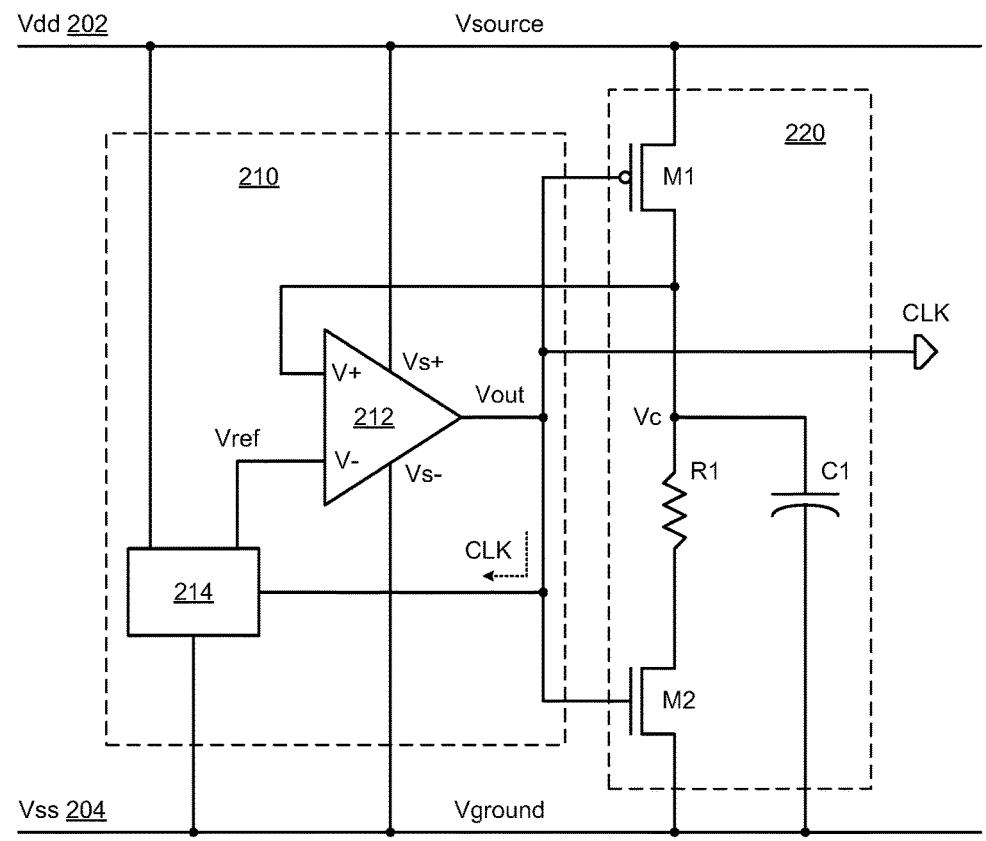
FIGS. 2-7 illustrate diagrams of integrated oscillator circuitry in accordance with various implementations described herein.

FIG. 2 illustrates a schematic diagram of integrated oscillator circuitry 200 in accordance with various implementations described herein. The integrated oscillator circuitry 200 may be referred to as an oscillator or oscillator circuit.

The oscillator circuitry 200 may include a first bus 202 configured to provide a source voltage Vdd (i.e., Vsource, supply voltage, input voltage, etc.). The first bus 202 may be referred to as a first voltage rail for supplying power (i.e., source voltage Vdd) to the oscillator circuitry 200 from an input voltage source. In various implementations, the input voltage source may include a battery source (i.e., Vbat or Vbattery), such as, e.g., a NiMH battery source or various other types of battery sources. Further, the oscillator circuitry 200 may include a second bus 204 configured to provide a ground voltage Vss (i.e., Vground, ground voltage, ground (GND), etc.). As such, the second bus 204 may be referred to as a second voltage rail for providing the ground voltage Vss or GND to the oscillator circuitry 200. In some cases, the supply voltage Vdd may refer to a first power supply voltage, and the ground voltage Vss may refer to a second power supply voltage having a different potential than the first power supply voltage.

The oscillator circuitry 200 may include multiple stages including a first stage 210 and a second stage 220. As shown in FIG. 2, the first and second stages 210, 220 may be coupled between the first and second buses 202, 204 in a parallel manner. However, alternative implementations may be used to achieve similar results.

The first stage 210 may include a comparator stage interposed between the first bus 202 for connection to the source voltage Vdd and the second bus 204 for connection to the ground voltage Vss. The comparator stage 210 may be configured to provide a clock signal CLK based on the source voltage Vdd and a fixed ratio of the source voltage via node Vc. Further, as shown in FIG. 2, the comparator stage 210 may include a voltage comparator 212 and a voltage divider 214 arranged to receive the source voltage Vdd as a first input signal, receive the fixed ratio of the source voltage at node Vc as a second input signal, and provide the clock signal CLK as an output signal based on the source voltage Vdd and the fixed ratio of the source voltage at node Vc. In various implementations, the voltage comparator 212 may be referred to as a comparator or a clock comparator. Further, as described in reference to FIG. 6 below, the voltage divider 214 may be referred to as a switched capacitor network, circuit, or stage.

In some implementations, the voltage comparator 212 may be implemented with an operational amplifier (op amp) configured to receive the source voltage Vdd via a positive power supply input Vs+ and receive the ground voltage Vss via a negative power supply input Vs−. The voltage comparator 212 may also be configured to receive a voltage reference signal Vref from the voltage divider 214 via a non-inverting input V+, and receive the fixed ratio of the voltage source at node Vc from the second stage 220 via an inverting input V−. Further, the voltage comparator 212 may also be configured to output the clock signal CLK via an output Vout. In some other implementations, the voltage comparator 212 may be implemented or referred to as a precision comparator.

In some implementations, during operation, the voltage comparator 212 may be configured to sense when a voltage level of the capacitor C1 is near or equal to or at least greater than the fixed ratio of the source voltage at node Vc and use the voltage level of the clock signal CLK to switch transistors M1, M2 so as to allow charging of the capacitor C1 to the source voltage Vdd. Further, in some other implementations, during operation, the voltage comparator 212 may be configured to sense when a voltage level of the capacitor C1 is near or equal to the source voltage Vdd and use the voltage level of the clock signal CLK to switch the transistors M1, M2 so as to allow discharging of the capacitor C1 to the fixed ratio of the source voltage at node Vc.

The voltage divider 214 may be configured to receive the source voltage Vdd as an input signal, divide the source voltage Vdd by a predetermined amount, and then provide a portion (or part thereof) of the source voltage Vdd as a reference voltage Vref to the voltage comparator 212 based on the divided source voltage. Further, in some other cases, the clock signal CLK may be implemented as a feedback signal FB from the voltage comparator 212 to the voltage divider 214. Therefore, this feedback signal FB may be utilized by the voltage divider 214 to adjust, regulate, or maintain the reference voltage Vref to near or equal to the divided source voltage, such as, e.g., about one-third (⅓) of the source voltage Vdd.

The second stage 220 may include a resistor-capacitor (RC) stage interposed between the first bus 202 for connection to the source voltage Vdd and the second bus 204 for connection to the ground voltage Vss. The RC stage 220 may be referred to as a relaxation circuit or stage. The RC stage 220 may include a resistor R1, the capacitor C1, and the multiple transistors M1, M2 arranged to provide the fixed ratio of the source voltage at node Vc by switching between charging and discharging of the capacitor C1 through the resistor R1 based on a voltage level of the clock signal CLK provided by the comparator stage 210. In some implementations, the resistor R1 and capacitor C1 may be arranged in parallel. Further, the multiple transistors M1, M2 may include a first transistor M1 and a second transistor M2, and as shown in FIG. 2, the resistor R1 and the capacitor C1 may be disposed between the first and second transistors M1, M2.

In some cases, when the voltage level of the clock signal CLK is near or equal to the fixed ratio of the source voltage at node Vc, the transistors M1, M2 may be configured to switch to charge the capacitor C1 to the source voltage Vdd. In some other cases, when the voltage level of the clock signal CLK is near or equal to the source voltage Vdd, the transistors M1, M2 may be configured to switch to discharge the capacitor C1 to the fixed ratio of the source voltage at node Vc.

Further, in some implementations, the RC stage 220 may be configured to provide a resistor-capacitor relaxation phase during discharging of the capacitor C1. For instance, during the resistor-capacitor relaxation phase, the RC stage 220 may be configured to regulate discharging of the capacitor C1 so as to assist the comparator stage 210 with providing the clock signal CLK as an output signal that is independent of the source voltage Vdd.

In various implementations, the first bus 202 may be configured to provide a source voltage Vdd, and the reference voltage Vref may be within a range of approximately one-third (⅓) of the source voltage Vdd, As described herein, each of the stages may utilize one or more circuit components that may be configured for operating with one or more of the first and second power supply voltages.

In some implementations, the first and second transistors M1, M2 may include complementary transistors. For instance, the first and second transistors M1, M2 may include metal-oxide-semiconductor (MOS) transistors, and the first transistor M1 may include a p-type MOS (PMOS) transistor, and the second transistor M2 may include an n-type MOS (NMOS) transistor. In other implementations, the placement of the first and second transistors M1, M2 may be reversed, and the resistor R1, the capacitor C1, and the first and second transistors M1, M2 may be arranged to perform similar functionality as described herein in reference to the RC stage 220.

In accordance with various implementations described herein, FIG. 2 refers to a Vdd independent RC oscillator configured to achieve Vdd independence by using a reference that is a fixed ratio of Vdd. Further, the fixed ratio of Vdd is obtained from the RC stage 220 and is PVT independent.

In some implementations, the oscillator circuitry 200 of FIG. 2 may operate in a manner as follows. With CLK=0 apriori, Vc charges rapidly to Vdd. The comparator 210 senses Vc>Vref, and CLK is pulled high. In some cases, the CLK (0→1) delay may be sufficient for Vc to charge to Vdd (when M1 is sized accordingly). Once CLK is high, the RC relaxation phase may start. As Vc discharges and hits Vc=Vdd/3, CLK is pulled low by the comparator 210. This process repeats. Further, the voltage divider or switched capacitor stage 214 may be self-clocked.

Figure 3:
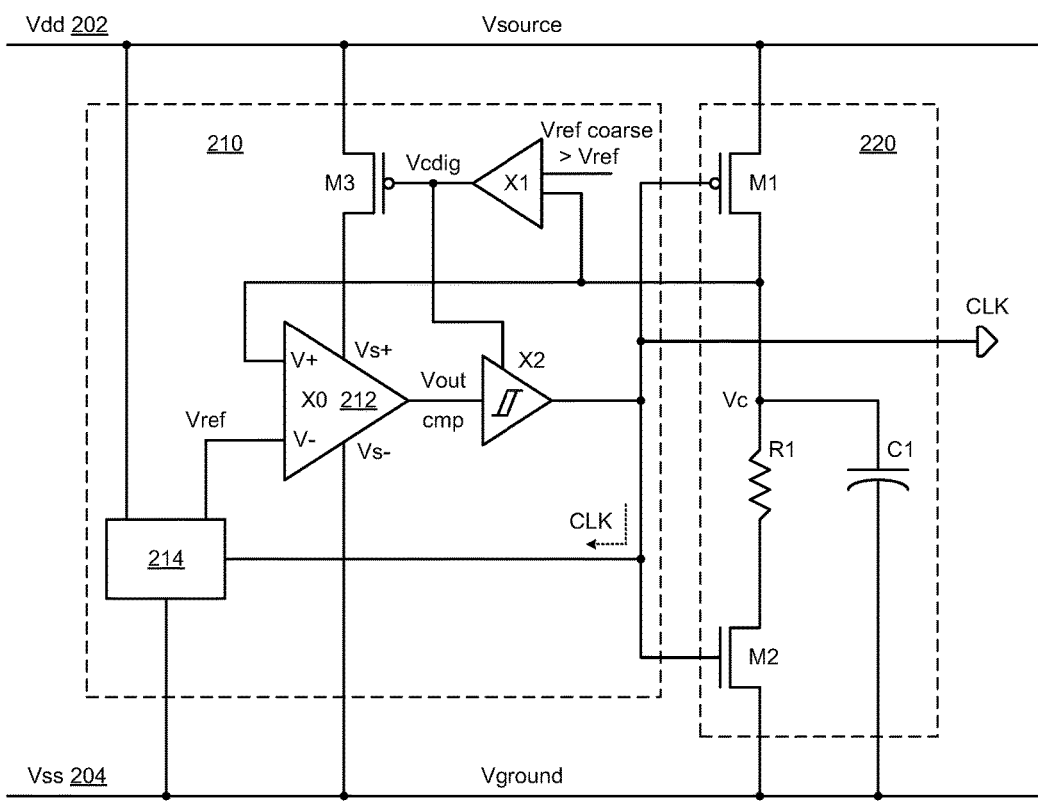

FIG. 3 illustrates a schematic diagram of integrated oscillator circuitry 300 in accordance with various implementations described herein. As shown in FIG. 3, the integrated oscillator circuitry 300 may be implemented with multiple stages may be referred to as an oscillator or oscillator circuit.

In one implementation, the oscillator circuitry 300 of FIG. 3 may include the oscillator circuitry 200 of FIG. 2 with incorporation of one or more additional devices or components, including, e.g., a low-power, low-precision coarse comparator X1, a Schmitt trigger X2, and a third transistor M3 provided in the comparator stage 210. As shown in FIG. 3, the third transistor M3 may be disposed between the first bus 202 and the positive power supply input Vs+ of the voltage comparator 212 (X0) so as to provide the voltage source Vdd to the positive power supply input Vs+ when activated. The third transistor M3 may include a PMOS transistor. The coarse comparator X1 may be disposed between the non-inverting input V+ of the voltage comparator 212 (X0) and a gate of the third transistor M3. The Schmitt trigger X2 may be coupled to the output Vout of the voltage comparator 212 (X0). Further, an output of the coarse comparator X1 may be coupled to the Schmitt trigger X2.

In some cases, the oscillator circuitry 300 of FIG. 3 may be configured to implement the precision voltage comparator 212 (X0) as a duty-cycled comparator for low power operation. For instance, observing that a comparison may only be necessary when Vc is near or close to Vref, duty-cycling may be applied to the voltage comparator 212 (X0) for providing improved precision and low-power operation. In contrast, a coarse low-power comparator may be used to activate the voltage comparator 212 (X0) just-in-time for precise comparison.

In some implementations, the oscillator circuitry 300 of FIG. 3 may operate in a manner as follows. The coarse comparator X1 may be used to perform a coarse comparison. When Vc>$V_{IL}$ of the first coarse comparator X1, the voltage comparator 212 (X0) may be power gated, e.g., with the third transistor M3. The voltage comparator 212 (X0) may only be turned on for $V_{IL}$=>Vc=>Vref. In some cases, $V_{IL}$ variation with PVT may affect a duty-cycle ratio, and hence, only power may be affected and not stability of the oscillator circuit 300. Further, $V_{IL}$ of the coarse comparator X1 may be designed to be greater than Vref across PVT. Still further, an output clamp may be provided for the duration when the voltage comparator 212 (X0) is power gated due to its output Vout being tri-stated. In this instance, the Schmitt trigger X2 may be disposed in-line with the output Vout of the voltage comparator 212 (X0) to provide an output clamp.

As shown in FIG. 3, Vcdig refers to a power gating signal provided from the coarse comparator X1 to the gate of the third transistor M3, and cmp refers to the output Vout of the voltage comparator 212 (X0). In some cases, cmp may be invalid for a duration when Vcdig is high. Further, CLK may be clamped to Vdd during this phase but allowed to transition when Vc=VDD/3. In this instance, the timing is independent of Vdd. Practically, however, a race may exist between cmp rising and Vcdig, and cmp may be clamped to a correct state before switching off the voltage comparator (X0).

Figure 4:
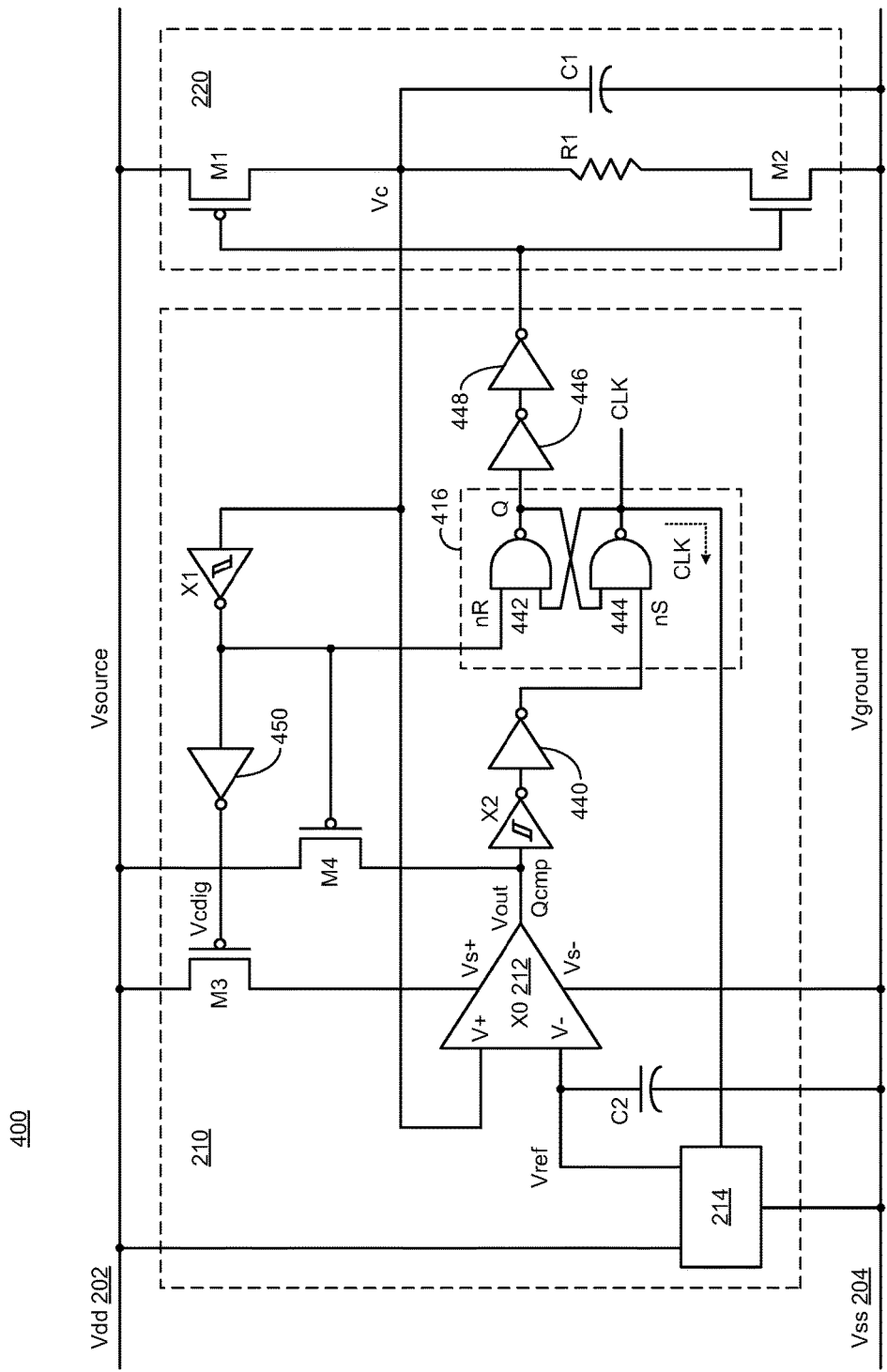

FIG. 4 illustrates a schematic diagram of integrated oscillator circuitry 400 in accordance with various implementations described herein. As shown in FIG. 4, the integrated oscillator circuitry 400 may be implemented with multiple stages may be referred to as an oscillator or oscillator circuit.

In one implementation, the oscillator circuitry 400 of FIG. 4 may include the oscillator circuitry 300 of FIG. 3 with incorporation of one or more additional devices or components, including, e.g., a fourth transistor M4 and a plurality of logic devices 440, 442, 444, 446, 448, 450 provided in the comparator stage 210. As shown in FIG. 4, the fourth transistor M4 may be disposed between the first bus 202 and the output Vout (Qcmp) of the voltage comparator 212 (X0) so as to provide the voltage source Vdd to the output Vout (Qcmp) when activated. The fourth transistor M4 may include a PMOS transistor. In some cases, a second capacitor C2 may be coupled between the inverting input Vs− of the voltage comparator 212 (X0) and the second bus 204 (Vss). In some cases, the coarse comparator X1 may be implemented as a Schmitt trigger. As such, in some implementations, the oscillator circuitry 400 of FIG. 4 may include a first Schmitt trigger X1 and a second Schmitt trigger X2.

Further, the oscillator circuitry 400 may include an RS latch 416 having NAND gates 442, 444. The output of the first Schmitt trigger X1 may be coupled to a gate of the fourth transistor M4, an input of an inverter 450, and an input of a first NAND gate 442. The inverter 450 may be coupled and disposed between an output of the first Schmitt trigger X1 and the gate of the third transistor M3. The output of the second Schmitt trigger X2 may be coupled to an input of an inverter 440, and an output of the inverter 440 may be coupled to an input of a second NAND gate 444. The output of the first NAND gate 442 (Q) may be coupled to another input of the second NAND gate 444, and similarly, the output of the second NAND gate 444 may be coupled to another input of the first NAND gate 442. The output of the first NAND gate 442 (Q) may be coupled to an input of an inverter 446, an output of the inverter 446 may be coupled to an input of an inverter 448, and an output of the inverter 448 may be coupled to the gates of the first and second transistors M1, M2 of the RC stage 220. As shown, the output of the second NAND gate 444 may be configured to provide the clock signal CLK and the feedback signal FB to the voltage divider 214.

Figure 6:
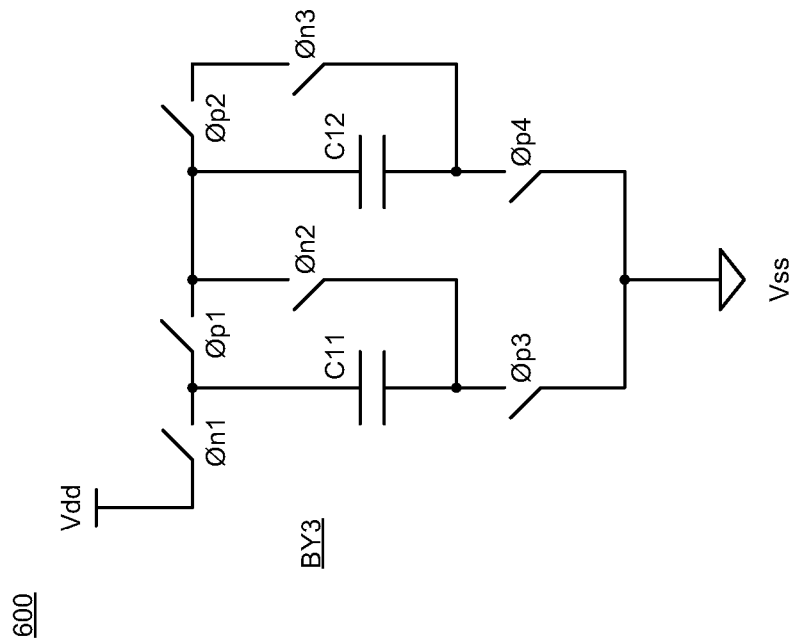
Figure 5:
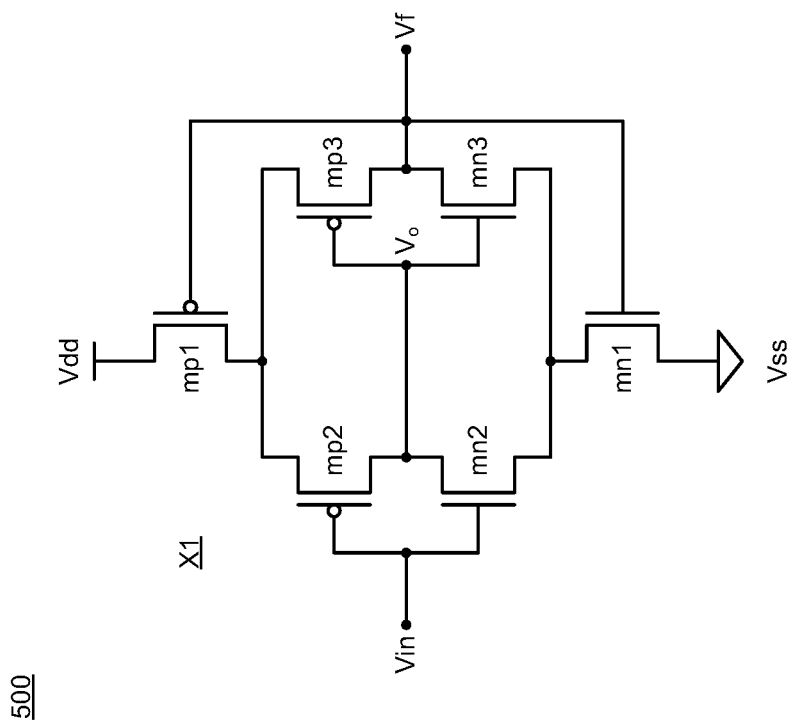

In some implementations, the voltage divider 214 may use MOS capacitors (e.g., as shown in FIG. 6), and the second capacitor C2 may be selected to avoid switched capacitor (SC) ripple that may affect stability. The RS latch 416 may be employed to ensure the CLK set and reset is dictated by Vc and cmp (Vout) respectively avoiding a race. The inverters 446, 448 following the RS latch 416 may function to provide sufficient delay so that Vc reaches Vdd although the first Schmitt trigger X1 initiates a reset of the RS latch 416 as soon as Vc hits $V_{IH}$ of the first Schmitt trigger X1. FIG. 5 below shows one implementation of an internal circuitry of the first Schmitt trigger X1, which may be a low power variant of a conventional Schmitt trigger. The design of the first Schmitt trigger X1 in FIG. 5 may limit short-circuit current through the first Schmitt trigger X1, and the inverters 446, 448 switch due to leakage currents through mp1 or mn1.

FIG. 5 illustrates a schematic diagram of circuitry 500 for implementing the first Schmitt trigger X1 of the oscillator circuitry 400 of FIG. 4 in accordance with various implementations described herein.

As shown in FIG. 5, the circuitry 500 may include multiple PMOS and NMOS transistors mp1, mp2, mp3, mn1, mn2, mn3 arranged to implement the first Schmitt trigger X1 of FIG. 4. For instance, a first PMOS transistor mp1 may be coupled between Vdd and second and third PMOS transistors mp2, mp3, and a first NMOS transistor mn1 may be coupled between second and third NMOS transistors mn2, mn3 and Vss. An input Vin of the first Schmitt trigger X1 may be coupled to a gate of the second PMOS transistor mp2 and a gate of the second NMOS transistor mn2. An output Vf of the first Schmitt trigger X1 may be coupled to a gate of the first PMOS transistor mp1 and a gate of the first NMOS transistor mn1, and the output Vf may also be coupled between the third PMOS transistor mp3 and the third NMOS transistor mn3. Further, gates of the third PMOS transistor mp3 and the third NMOS transistor mn3 may be coupled between the second PMOS transistor mp2 and the second NMOS transistor mn2.

FIG. 6 illustrates a schematic diagram of circuitry 600 for implementing the voltage divider 214 in the oscillator circuitry 400 of FIG. 4 in accordance with various implementations described herein.

As shown in FIG. 6, the circuitry 600 may refer to a switched capacitor stage and may include multiple switches Øp, Øn and multiple capacitors C11, C12 arranged to implement the voltage divider 214 in the oscillator circuitry 400 of FIGS. 2, 3, and/or 4. The switched capacitor stage 214 may be referred to as a voltage divider, such as, e.g., in some implementations, a divide-by-3 (BY3) voltage divider. In some cases, the switches Øp, Øn may be implemented with PMOS and NMOS transistors. A first n-type switch Øn1 may be coupled between Vdd and a first p-type switch Øp1. A first p-type switch Øp1 may be coupled between the first n-type switch Øn1 and a second p-type switch Øp2. A terminal of a first capacitor C11 may be coupled to a node between the first n-type switch Øn1 and the first p-type switch Øp1, and another terminal of the first capacitor C11 may be coupled to a third p-type switch Øp3. A second n-type switch Øn2 may be coupled to a node between the first and second p-types switches Øp1, Øp2 and further to the third p-type switch Øp3. The second n-type switch Øn2 is coupled in parallel with the first capacitor C11. The third p-type switch Øp3 is coupled between the first capacitor C11 and Vss. A terminal of a second capacitor C12 may be coupled to the node between the first and second p-types switches Øp1, Øp2, and another terminal of the second capacitor C12 may be coupled to a fourth p-type switch Øp4. A third n-type switch Øn3 may be coupled between the second p-type switch Øp2 and a node between the second capacitor C12 and the fourth p-type switch Øp4. The fourth p-type switch Øp4 may be coupled between the second capacitor C12 and Vss.

Figure 7:
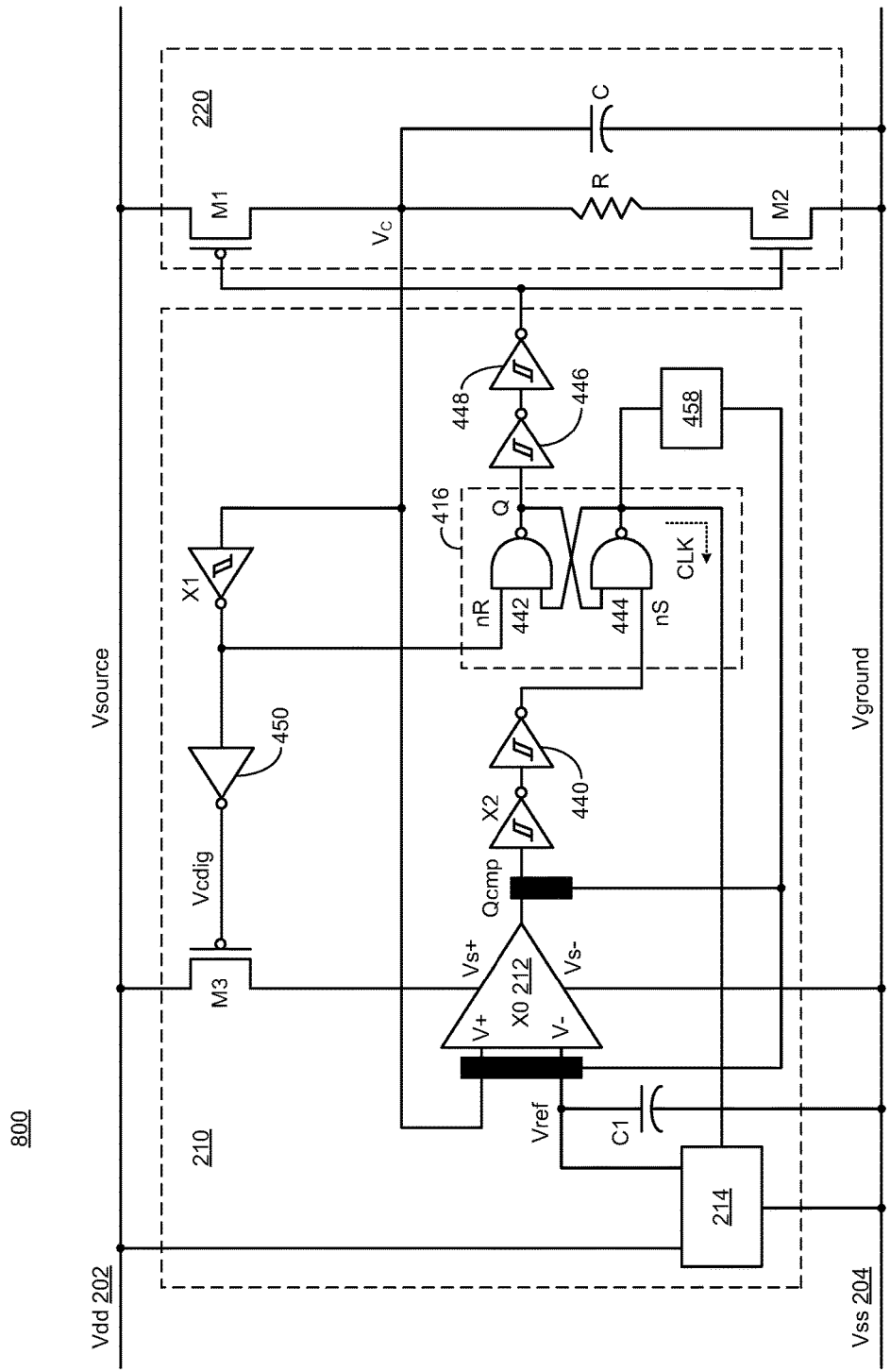

FIG. 7 illustrates a schematic diagram of integrated oscillator circuitry 700 in accordance with various implementations described herein. As shown in FIG. 7, the integrated oscillator circuitry 700 may be implemented with multiple stages may be referred to as an oscillator or oscillator circuit. In some cases, a common issue with chopping may refer to error introduced by clock-injection. This design is robust to clock-injection noise as the comparator 212 may be turned off when chopping switches fire.

In one implementation, the oscillator circuitry 700 of FIG. 7 may include the oscillator circuitry 400 of FIG. 4 with incorporation of one or more additional devices or components, including, e.g., another clock divider 458 and the logic devices 440, 446, 448, which may be implemented as Schmitt triggers. The clock divider 458 may be a flip-flop that may be used as a clock signal divider configured to provide a clock signal divided by 2 (i.e., CLK/2). As shown in FIG. 7, the clock divider 458 may be disposed between the output of the second NAND gate 444 and the output Vout (Qcmp) of the comparator or clock comparator 212 (X0). Further, the clock divider 458 may be disposed between the output of the second NAND gate 444 and across the inputs Vs+, Vs− of the clock comparator 212 (X0). In some cases, as shown in FIG. 7, the fourth transistor M4 may be removed.

In some implementations, the oscillator circuitry 700 may be configured with chopping to cancel comparator offset. In FIG. 7, chopping may be employed in the oscillator circuitry 700 to convert period jitter to duty-cycle jitter to improve stability. The absence of clock CLK for the SC reference may introduce start-up delay, which may be undesirable in certain applications. This may be overcome by having a coarse start-up oscillator that may be disabled after oscillations kick-in. Further, self-clocking may be achieved using a clock derived from a divided version of the main clock so as to trade-off frequency stability for power. In some cases, an extension to the scheme described here may implement Vref>Vdd/2.

Figure 8:
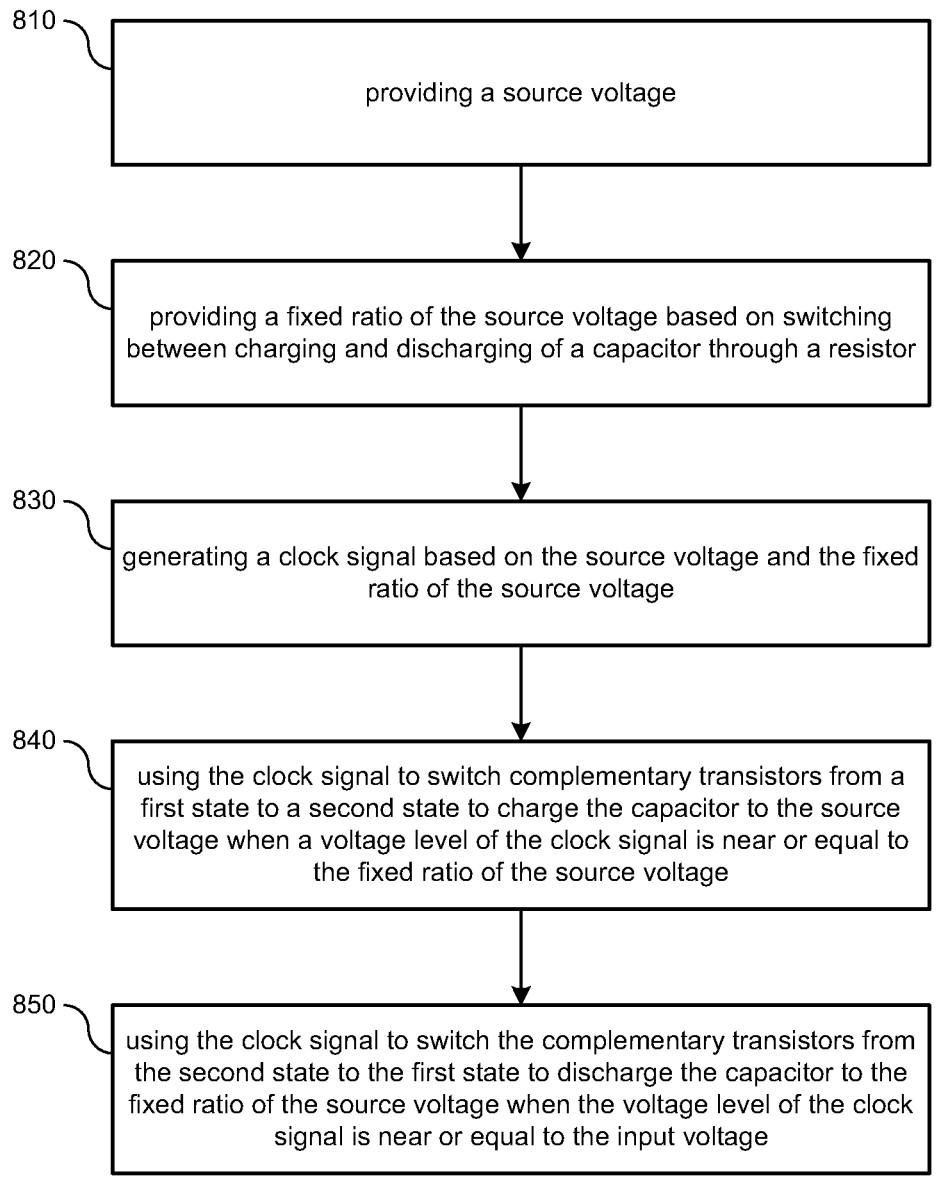
FIG. 8 illustrates a process flow diagram of a method for providing an oscillator in accordance with various implementations described herein.

FIG. 8 illustrates a process flow diagram of a method for providing an oscillator in accordance with various implementations described herein.

It should be understood that while method 800 indicates a particular order of execution of operations, in some examples, certain portions of the operations might be executed in a different order, and on different systems. In some other examples, one or more additional operations and/or steps may be added to method 800. Similarly, some operations and/or steps may be omitted. In one implementation, steps 810-850 below are described with reference to FIG. 2. However, in various other implementations, steps 810-850 below may be applied to any one of FIGS. 3-7.

At block 810, method 800 may provide a source voltage. The source voltage may refer to an input voltage, such as e.g., Vdd or Vsource. At block 820, method 800 may provide a fixed ratio (or portion) of the source voltage based on switching between charging and discharging of a capacitor through a resistor. At block 830, method 800 may generate or provide a clock signal based on the source voltage and the fixed ratio of the source voltage. Further, at block 840, method 800 may use the clock signal to switch complementary transistors from a first state to a second state to charge the capacitor to the source voltage when a voltage level of the clock signal is near or equal to the fixed ratio of the source voltage. At block 850, method 800 may use the clock signal to switch the complementary transistors from the second state to the first state to discharge the capacitor to the fixed ratio of the source voltage when the voltage level of the clock signal is near or equal to the input voltage.

In some implementations, method 800 may include dividing the source voltage by a predetermined amount, providing a reference voltage based on the divided source voltage, and generating the clock signal based on the source voltage, the reference voltage, and the fixed ratio of the source voltage. The predetermined amount may be three (3). Method 800 may include arranging the resistor and the capacitor in parallel, and method 800 may include disposing the resistor and capacitor between the complementary transistors. Further, method 800 may include arranging the resistor, the capacitor, and the complementary transistors to provide a resistor-capacitor relaxation phase during discharging of the capacitor. In some cases, during the resistor-capacitor relaxation phase, discharge of the capacitor is regulated so as to assist with providing the clock signal as an output that is independent of the input voltage.

Figure 9A:
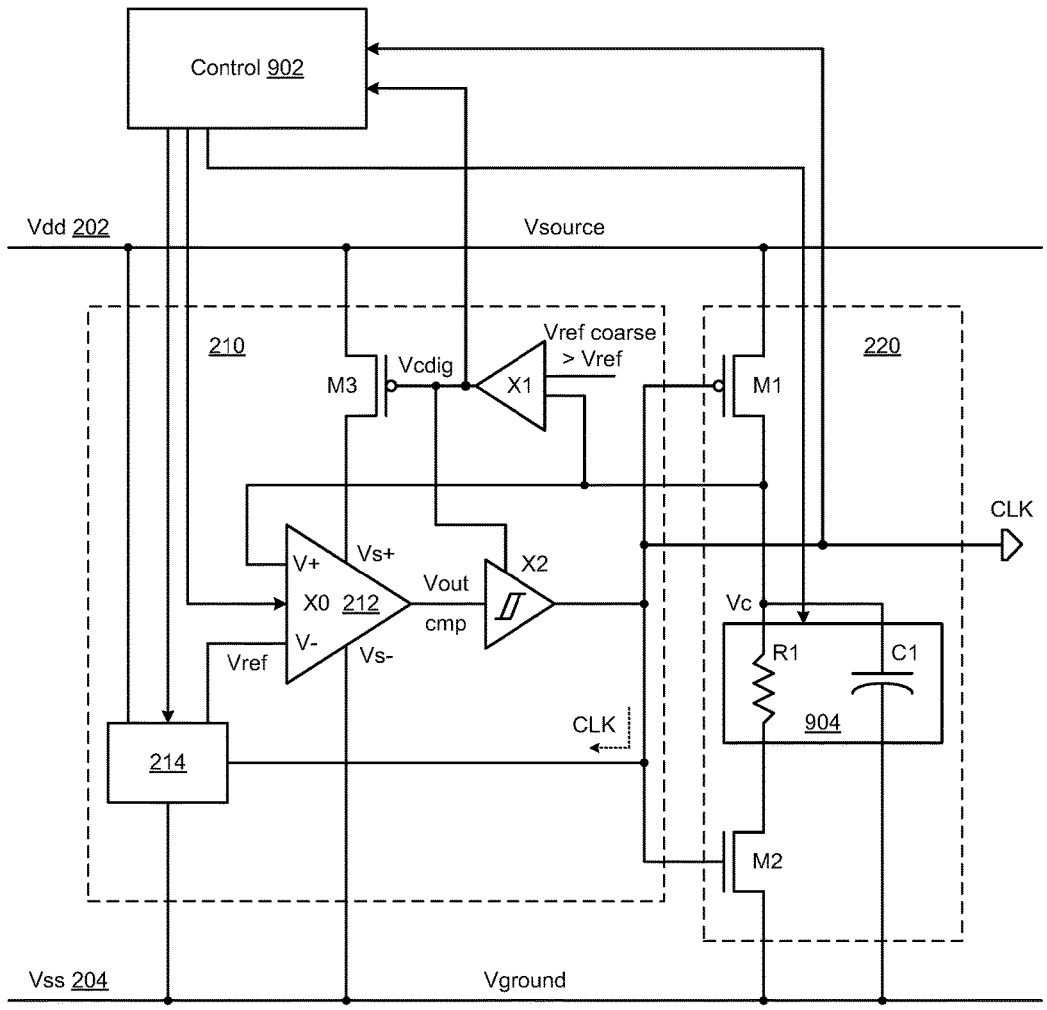
FIGS. 9A-9C illustrate various other diagrams of integrated oscillator circuitry in accordance with various implementations described herein.
Figure 9B:
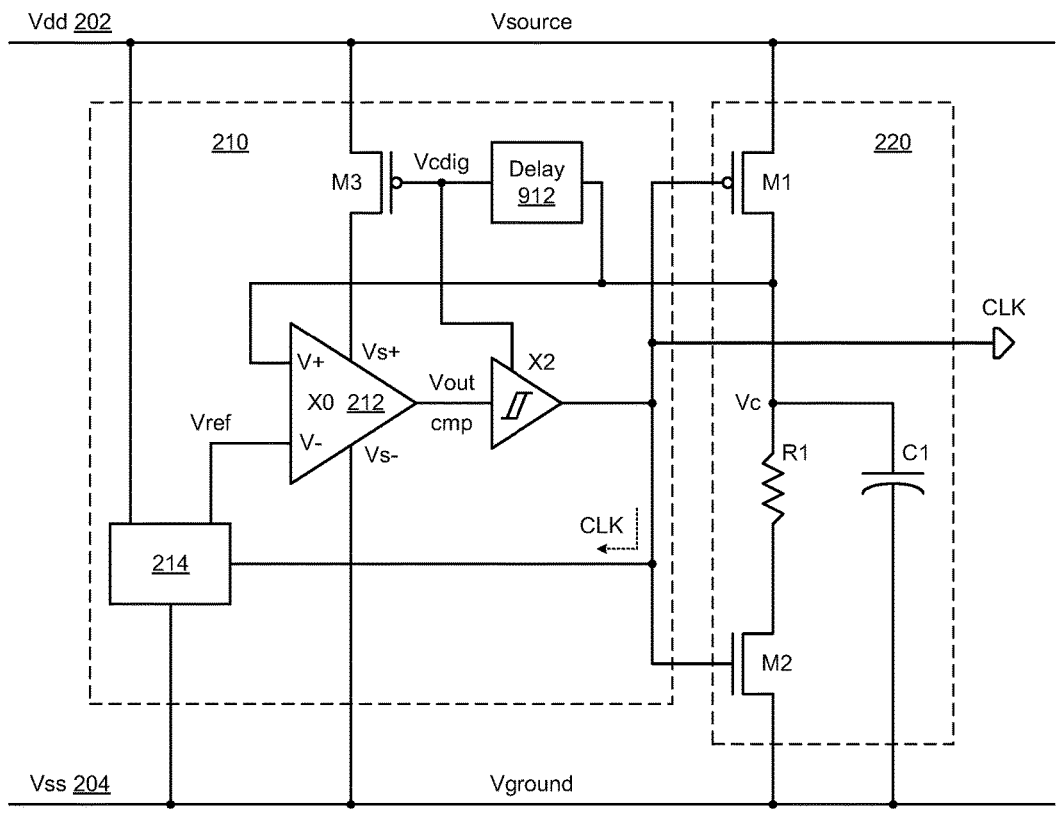
Figure 9C:
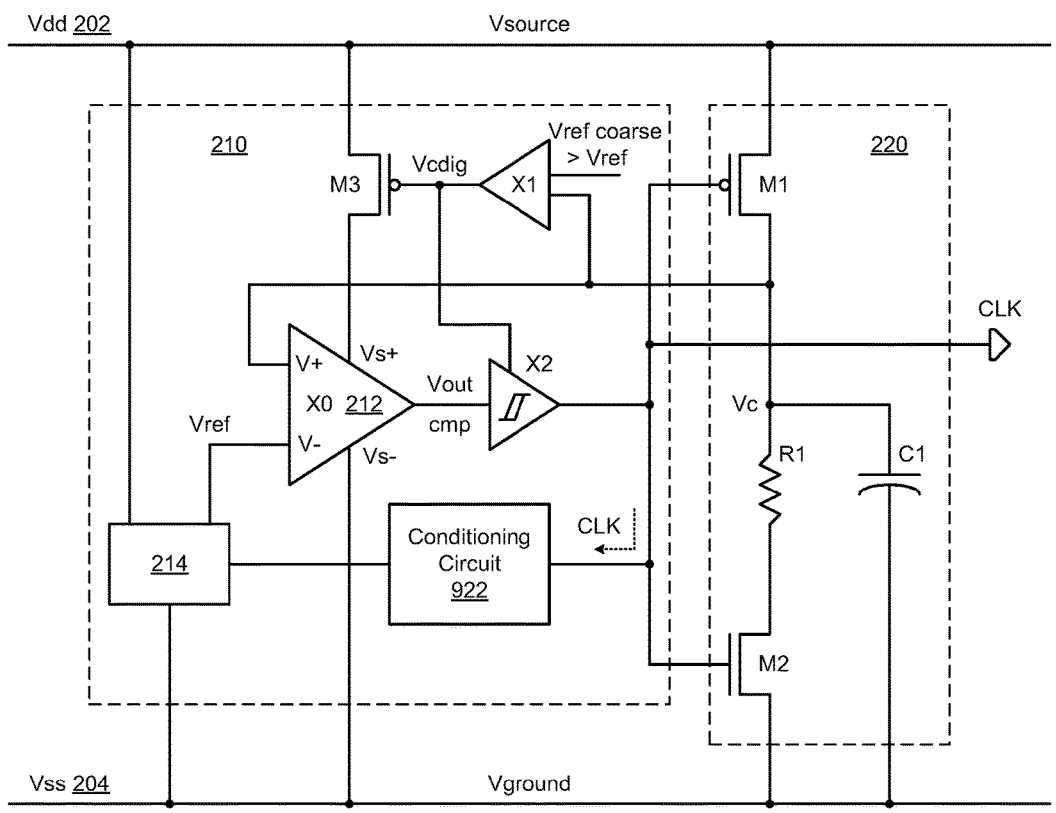

FIGS. 9A-9C illustrate various other diagrams of integrated oscillator circuitry in accordance with various implementations described herein. In particular, FIG. 9A illustrates integrated oscillator circuitry 900A having a control block or circuit 902, FIG. 9B illustrates integrated oscillator circuitry 900B having a delay block or circuit 912, and FIG. 9C illustrates integrated oscillator circuitry 900C having a conditioning block or circuit 922. As shown, the integrated oscillator circuitry 900A, 900B, 900C may be variant implementations of the integrated oscillator circuitry 300 of FIG. 3, where similar components have similar functionality.

As shown in FIG. 9A, the control block 902 may be configured to receive one or more input signals, such as, e.g., the clock signal CLK and the power gating signal Vcdig provided from the coarse comparator X1. Further, as shown in FIG. 9A, the control block 902 may be configured to provide control signals to the voltage comparator 212 (XO), the voltage divider 214, and/or a resistor-capacitor (RC) block 904. The RC block 904 may include the resistor R1 and the capacitor C1.

The coarse comparator output from X1 may be less independent of VDD and temperature when compared to the clock signal CLK. For instance, the output from X1 may include a high-voltage Vcdig (VCDIG_HV) and a low-voltage Vcdig (VCDIG_LV) that are coarse comparator outputs having off-times $T_{hv}$ and $T_{lv}$ at high and low voltages, respectively. The clock signal CLK, however, may have a VDD independent period. This relative variation may allow the power gating signal Vcdig to be used as a pulse-width-modulated signal with the pulse width representing a combination effect of voltage and temperature. Thus, in some cases, the control block 902 may be configured to use this information to improve stability or reduce power of the oscillator circuitry 900A.

Therefore, in various implementations, the integrated oscillator circuitry 900A of FIG. 9A may refer to a scheme to use the control block 902 to control the behaviour of one or more of the voltage comparator 212 (X0), the voltage divider 214, and/or the second stage 220 (e.g., via RC block 904) using the power gating signal Vcdig. In these instances, the power gating signal Vcdig may appear as a pulse-width-modulated signal with an oscillator frequency as a carrier and a supply voltage and/or temperature as a modulation source. Thus, the power gating signal Vcdig may be representative of supply and/or temperature, and the circuit behaviour may be modified using the power gating signal Vcdig to improve performance.

As shown in FIG. 9B, the delay block 912 may be implemented to replace the coarse comparator X1. In this instance, as shown, the delay block 912 may be disposed between the non-inverting input V+ of the voltage comparator 212 (X0) and the gate of the third transistor M3. The integrated oscillator circuitry 900B may be configured to use a coarse delay line from the delay block 912 in lieu of the coarse comparator X1. In some implementations, the coarse delay line may be at a lower power than a coarse voltage comparator (e.g., leakage controlled delay). With use of the delay block 912, delay across the voltage and temperature range of interest may be tuned, e.g., such that a period of timing delay $T_{delay}$ is less than a period of the clock signal CLK. In this instance, the delay may be initiated by a rising edge of the clock signal CLK. In some implementations, at low voltage, the timing delay $T_{delay}$ may be longer, and at higher voltage, the timing delay $T_{delay}$ may be shorter. However, in some other implementations, as long as the coarse comparator X1 is able to power-up the precision comparator 212 (X0) in-time, the period of the clock signal CLK may remain unaffected.

Therefore, in various implementations, the integrated oscillator circuitry 900B of FIG. 9B may refer to a scheme where the coarse comparator X1 in FIG. 3 is replaced with a resettable delay element, such as e.g., the delay block 912. In this instance, the delay block 912 may provide a delay time that is less than an oscillation time period, and the delay time may be reset by the rising edge of the clock signal CLK.

As shown in FIG. 9C, the conditioning block 922 may be disposed between the output of the Schmitt trigger X2 and the voltage divider 214. Thus, the conditioning block 922 may be configured to receive the clock signal CLK, e.g., as output from the Schmitt trigger X2. In this instance, as shown, the conditioning block 922 is disposed on the feedback path to ensure that the integrated oscillator circuitry 900C remains functional across (PVT) corners. In various implementations, the conditioning block 922 may be configured as any of, but not limited to, non-overlapping clock generators, level-shifters, clock gating circuits, filters, dividers, and/or similar circuits.

Therefore, in various implementations, the integrated oscillator circuitry 900C of FIG. 9C may refer to using the conditioning block 922 on the clock signal CLK line provided to the voltage divider 214. In various implementations, the conditioning block 922 may be configured to modify the nature of the clock signal CLK. For instance, one or more non-overlapping clock generators may be configured to split the feedback signal (i.e., the clock signal CLK) provided as output from the Schmitt trigger X2.

Described herein are various implementations of an integrated circuit. In some implementations, the integrated circuit may include a comparator stage, a resistor, a capacitor, and active switches arranged to provide a clock signal having a time period that is independent of a first source voltage. Independence may be achieved by using a second source voltage derived from the first source voltage as a fixed ratio.

Described herein are various implementations of an oscillator. In some implementations, the oscillator may include a voltage divider configured to divide a source voltage by a predetermined amount and provide a reference voltage based on the divided input voltage. The oscillator may include a capacitor relaxation circuit having a resistor, a capacitor, a first transistor, and a second transistor arranged to provide a fixed ratio of the input voltage by switching between charging and discharging of the capacitor through the resistor. The oscillator may include a voltage comparator configured to receive the reference voltage as a first input, receive the fixed ratio of the input voltage as a second input, and provide a clock signal as an output based on the first and second inputs.

Described herein are various implementations of a method for providing a source voltage, providing a fixed ratio of the source voltage based on switching between charging and discharging of a capacitor through a resistor, and generating a clock signal based on the source voltage and the fixed ratio of the source voltage. The method may include using the clock signal to switch complementary transistors from a first state to a second state to charge the capacitor to the source voltage when a voltage level of the clock signal is near or equal to the fixed ratio of the source voltage. The method may include using the clock signal to switch the complementary transistors from the second state to the first state to discharge the capacitor to the fixed ratio of the source voltage when the voltage level of the clock signal is near or equal to the input voltage.

The discussion provided herein is directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a comparator stage that provides a clock signal based on a first source voltage and a fixed ratio of the first source voltage; and
   a resistor, a capacitor, and active switches arranged with the comparator stage to provide the clock signal with a time period that is independent of the first source voltage,
   wherein independence is achieved by using a second source voltage derived from the first source voltage as the fixed ratio, and
   wherein the comparator stage includes a voltage comparator and a switched-capacitor network, and wherein the second source voltage is derived as a reference voltage using the switched-capacitor network, and wherein the voltage comparator is implemented as a duty-cycled comparator for low power operation, and
   wherein the comparator stage includes a Schmitt trigger that is disposed in-line with an output of the voltage comparator to provide an output clamp to the clock signal, and
   wherein the comparator stage includes another voltage comparator having an output coupled to the Schmitt trigger so as to operate the Schmitt trigger and to control the output clamping of the clock signal.

2. The integrated circuit of claim 1, further comprising a control component configured to modify behavior of one or more of the comparator stage, the resistor, the capacitor, and the active switches so as to reduce power consumption.

3. The integrated circuit of claim 2, wherein the control component comprises a power-gating component configured to duty-cycle the comparator stage during the time-period.

4. The integrated circuit of claim 1, wherein the voltage comparator is arranged to receive a voltage across the capacitor as a first input signal and receive the second source voltage as a second input signal, and provide the clock signal as an output signal based on the voltage across the capacitor and the second source voltage.

5. The integrated circuit of claim 1, wherein the voltage comparator is configured to sense when a voltage level of the capacitor is near or equal to or at least greater than the second source voltage and use the voltage level of the clock signal to switch the active switches so as to allow charging of the capacitor to the first source voltage.

6. The integrated circuit of claim 1, wherein the voltage comparator is configured to sense when a voltage level of the capacitor is near or equal to the first source voltage and use the voltage level of the clock signal to switch the active switches so as to allow discharging of the capacitor to the second source voltage.

7. The integrated circuit of claim 1, wherein the switched-capacitor network is configured to receive the first source voltage as an input signal, divide the first source voltage by a predetermined amount, and provide a portion of the first source voltage as the reference voltage to the voltage comparator.

8. The integrated circuit of claim 1, further comprising a conditioning circuit configured to receive the clock signal, modify a behavior of the clock signal, and provide a feedback signal to the switched-capacitor network based on the modified clock signal.

9. The integrated circuit of claim 1, wherein the capacitor is configured to charge or discharge through the resistor resulting in a relaxation phase, and wherein the resistor and capacitor are arranged in parallel or series.

10. The integrated circuit of claim 1, wherein the multiple active switches comprise first and second transistors, and wherein the resistor and capacitor are disposed between the first and second transistors.

11. An oscillator, comprising:
    a voltage divider configured to divide a source voltage by a predetermined amount and provide a reference voltage based on the divided source voltage;
    a capacitor relaxation circuit having a resistor, a capacitor, a first transistor, and a second transistor arranged to provide a fixed ratio of the source voltage by switching between charging and discharging of the capacitor through the resistor;

a voltage comparator configured to receive the reference voltage as a first input, receive the fixed ratio of the source voltage as a second input, and provide a clock signal as an output based on the first and second inputs;

a Schmitt trigger that is disposed in-line with an output of the voltage comparator to provide an output clamp to the clock signal; and another voltage comparator having an output coupled to the Schmitt trigger so as to operate the Schmitt trigger and to control the output clamping of the clock signal, wherein the voltage divider comprises a switched-capacitor network, and wherein the reference voltage is derived using the switched-capacitor network, and wherein the voltage comparator is implemented as a duty-cycled comparator for low power operation.

12. The oscillator of claim 11, wherein:

the voltage comparator uses the clock signal to switch the first and second transistors from a first operational state to a second operational state to charge the capacitor to the source voltage when the voltage level of the clock signal is near or equal to the fixed ratio of the source voltage, and the voltage comparator uses the clock signal to switch the first and second transistors from the second operational state to the first operational state to discharge the capacitor to the fixed ratio of the source voltage when the voltage level of the clock signal is near or equal to the source voltage.

13. The oscillator of claim 11, further comprising a power-gating component configured to duty-cycle the voltage comparator so as to reduce power consumption.

14. The oscillator of claim 11, wherein the resistor and the capacitor are arranged in series or parallel, and wherein the resistor and the capacitor are disposed between the first and second transistors, and wherein the first and second transistors are complementary.

15. The oscillator of claim 11, wherein the relaxation circuit is configured to provide a resistor-capacitor relaxation phase of the capacitor.

16. A method, comprising:

providing a source voltage;

providing a fixed ratio of the source voltage based on switching between charging and discharging of a capacitor through a resistor;

deriving a reference voltage using a switched-capacitor network;

generating a clock signal from a voltage comparator based on the source voltage, the reference voltage, and the fixed ratio of the source voltage, wherein the voltage comparator is implemented as a duty-cycled comparator for low power operation;

using the clock signal to switch complementary transistors from a first state to a second state to charge the capacitor to the source voltage when a voltage level of the clock signal is near or equal to the fixed ratio of the source voltage;

using the clock signal to switch the complementary transistors from the second state to the first state to discharge the capacitor to the fixed ratio of the source voltage when the voltage level of the clock signal is near or equal to the source voltage;

clamping the clock signal with a Schmitt trigger that is disposed in-line with an output of the voltage comparator; and operating the Schmitt trigger with another voltage comparator having an output coupled to the Schmitt trigger so as to control clamping of the clock signal.

17. The method of claim 16, further comprising duty-cycling the voltage comparator so as to reduce power consumption.

18. The method of claim 16, further comprising:

dividing the source voltage by a predetermined amount using the switched-capacitor network;

providing the reference voltage based on the divided source voltage; and generating the clock signal based on the source voltage, the reference voltage, and the fixed ratio of the source voltage.

19. The method of claim 16, further comprising:

arranging the resistor and capacitor in parallel; and disposing the resistor and capacitor between the complementary transistors.

20. The method of claim 16, further comprising:

arranging the resistor, the capacitor, and the complementary transistors to provide a resistor-capacitor relaxation phase during discharging of the capacitor, wherein, during the resistor-capacitor relaxation phase, discharge of the capacitor is regulated so as to assist with providing the clock signal as an output that is independent of the source voltage.

* * * * *